(12) United States Patent
Tseng et al.

(10) Patent No.: US 7,268,409 B2
(45) Date of Patent: Sep. 11, 2007

(54) SPIRAL INDUCTOR WITH ELECTRICALLY CONTROLLABLE RESISTIVITY OF SILICON SUBSTRATE LAYER

(75) Inventors: Bor-Min Tseng, Hsin-Chu (TW); Chih-Sheng Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 10/851,021

(22) Filed: May 21, 2004

(65) Prior Publication Data

US 2005/0258507 A1 Nov. 24, 2005

(51) Int. Cl.
*H01L 27/06* (2006.01)
(52) U.S. Cl. .......... 257/531; 257/528; 257/E21.022; 438/238; 336/200
(58) Field of Classification Search .......... 257/531, 257/528, E21.022; 327/565, 566; 438/210, 438/238, 381; 336/200
See application file for complete search history.

(56) References Cited

U.S. PATENT DOCUMENTS

| | | | |
|---|---|---|---|
| 5,717,243 A | 2/1998 | Lowther | |
| 5,748,417 A | 5/1998 | Malhotra et al. | |
| 5,754,377 A | 5/1998 | Gray et al. | |
| 6,194,961 B1 * | 2/2001 | Passeraub | 327/566 |
| 6,211,753 B1 | 4/2001 | Leifso et al. | |
| 6,489,663 B2 | 12/2002 | Ballantine et al. | |
| 6,656,813 B2 | 12/2003 | Ahn et al. | |
| 6,903,644 B2 * | 6/2005 | Wang et al. | 336/200 |
| 2001/0002060 A1 * | 5/2001 | Forbes | 257/528 |
| 2003/0006415 A1 * | 1/2003 | Yokogawa et al. | 257/77 |
| 2003/0034821 A1 * | 2/2003 | Mallardeau et al. | 327/296 |
| 2003/0231093 A1 * | 12/2003 | Hsu et al. | 336/200 |
| 2005/0024176 A1 * | 2/2005 | Wang et al. | 336/200 |

FOREIGN PATENT DOCUMENTS

| | | |
|---|---|---|
| WO | WO 98/50956 | 11/1998 |
| WO | WO 02/49110 | 6/2002 |
| WO | WO 2004/102665 | * 11/2004 |

OTHER PUBLICATIONS

Yong-Ho Cho, A Novel Active Inductor and Its Application to Inductance-Controlled Oscillator, IEEE Transactions on Microwave Theory and Techniques, Aug. 1997, pp. 1208-1213, vol. 45, No. 8, 0018-9480/97.

Stepan Lucyszyn, "Monolithic Narrow-Band Filter Using Ultrahigh-Q Tunable Active Inductors", IEEE Transactions on Microwave Theory and Techniques, Dec. 1994, pp. 2617-2622, vol. 42, No. 12, 0018-9480/94.

* cited by examiner

*Primary Examiner*—Eugene Lee
*Assistant Examiner*—William Kraig
(74) *Attorney, Agent, or Firm*—Haynes and Boone, LLP

(57) ABSTRACT

A microelectronic device including, in one embodiment, a plurality of active devices located at least partially in a substrate, at least one dielectric layer located over the plurality of active devices, and an inductor located over the dielectric layer. At least one of the plurality of active devices is located within a columnar region having a cross-sectional shape substantially conforming to a perimeter of the inductor. The at least one of the plurality of active devices may be biased based on a desired Q factor of the inductor or and/or an operating frequency of the microelectronic device.

39 Claims, 5 Drawing Sheets

_US 7,268,409 B2_

SPIRAL INDUCTOR WITH ELECTRICALLY CONTROLLABLE RESISTIVITY OF SILICON SUBSTRATE LAYER

BACKGROUND

Microelectronic devices often employ a substrate having a plurality of active devices formed therein or thereon. A spiral inductor coil is often formed over the substrate, separated from the active devices and the remainder of the substrate by one or more dielectric layers. In most applications, the region of the substrate immediately underlying the inductor coil is void of the active devices, such as to avoid interference between the inductor and the active devices that may otherwise be detrimental to performance of the active devices.

However, the inductor is designed to provide a specific inductance that is predetermined based on the design specifications of the active devices and remainder of the microelectronic device in which the active devices are included. For example, a specific inductance may be required for a specific device operating frequency. Consequently, changes to the design specifications, as well as tolerance build-up and other manufacturing intricacies, can necessitate inductance values other than those for which the inductor was designed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
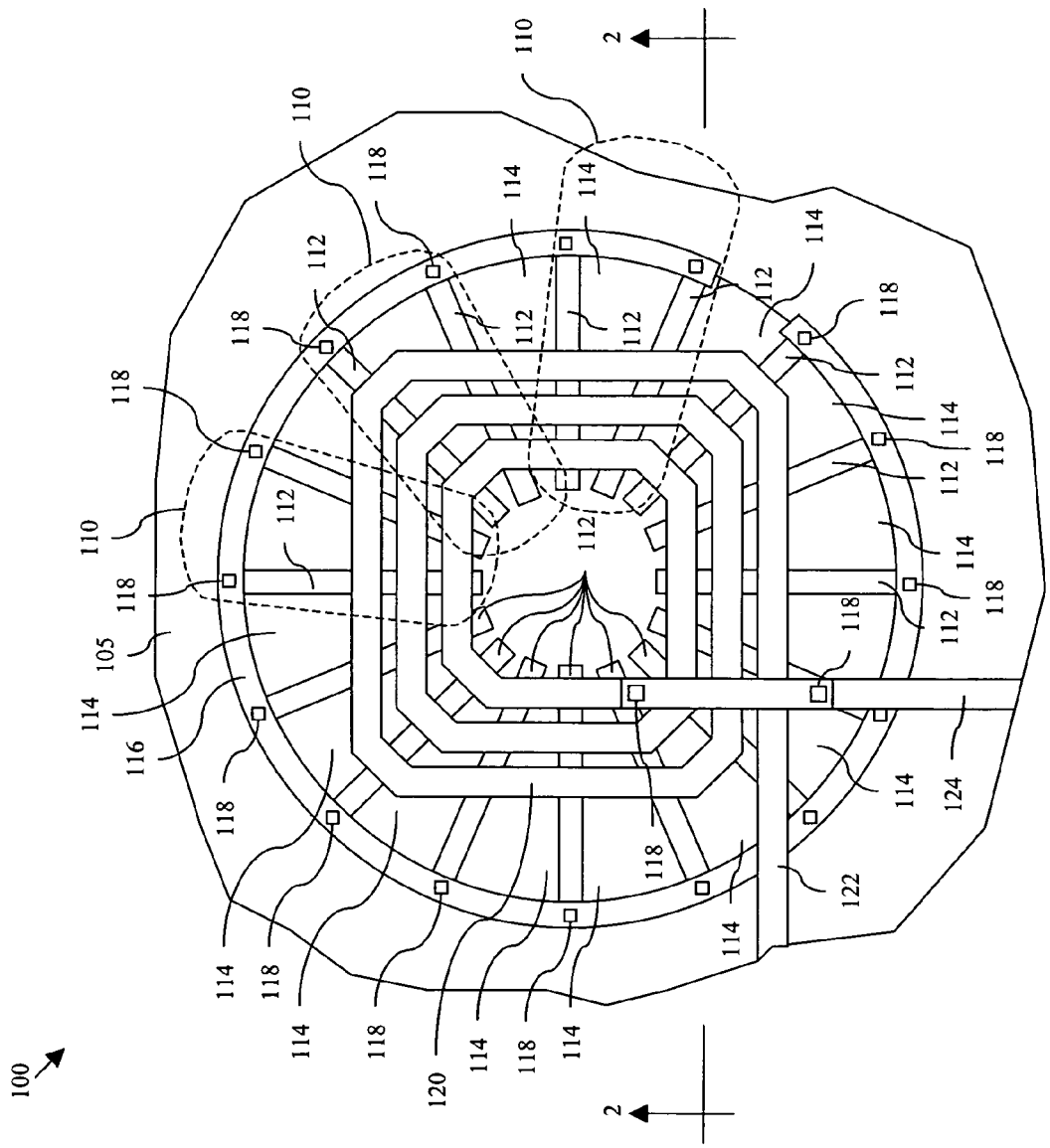
FIG. 1 is a plan view of at least a portion of one embodiment of a microelectronic device in an intermediate stage of manufacture according to aspects of the present disclosure.

It is to be understood that the following disclosure provides many different embodiments or examples. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a plan view of at least a portion of one embodiment of a microelectronic device 100 according to aspects of the present disclosure. The device 100 includes a substrate 105 having active devices 110 formed thereon and/or at least partially therein. Several of the active devices 110 are identified in FIG. 1 by dashed lines. The device 100 also includes an inductor 120 located over the active devices 110.

The substrate 105 may comprise silicon, gallium arsenide, gallium nitride, strained silicon, silicon germanium, silicon carbide, carbide, diamond, and/or other materials. A bulk portion of the substrate 105, or regions thereof, may be doped, such as with a P type and/or an N type dopant. In one embodiment, the substrate 105 comprises a silicon-on-insulator (SOI) substrate, such as a silicon-on-sapphire substrate, a silicon germanium-on-insulator substrate, or another substrate comprising an epitaxial or otherwise formed semiconductor layer on an insulator layer. The substrate 105 may also or alternatively comprise a fully depleted SOI substrate, possibly having an active layer thickness ranging between about 5 nm and about 200 nm. The substrate 105 may also or alternatively comprise an air gap, such as may be formed in a "silicon-on-nothing" (SON) structure. The substrate 105 may be grounded by conventional or future-developed means.

The active devices 110 may be or comprise one or more field-effect transistors (FETs), metal-oxide-semiconductor FETs (MOSFETs), and/or other types of transistors. The active devices 110 may also comprise one or more electrically programmable read only memory (EPROM) cells, electrically erasable programmable read only memory (EEPROM) cells, static random access memory (SRAM) cells, dynamic random access memory (DRAM) cells, single electron transistors (SETs), diodes, and/or other types of active devices. Moreover, the device 100 may include capacitors, inductors, and/or other passive devices in addition to or instead of the active devices 110. In general, the "active devices 110" employed between the inductor 120 and the bulk portion of the substrate 105 may include any device which may electrically adjust the inductance of the inductor 120, such as by changing the resistance or "lossiness" of the substrate 105.

In the illustrated embodiment, the active devices 110 include a plurality of gates 112 each interposing ones of a plurality of source/drain regions 114. The gates 112 may comprise doped or undoped polysilicon, molybdenum, hafnium, cobalt, nickel, tungsten, vanadium, bismuth, titanium, tantalum, aluminum, silicide, alloys thereof, and/or other materials. The gates 112 may be formed by lithography (including immersion photolithography, maskless lithography, and imprint lithography, among others, hereafter collectively referred to as lithography), chemical-vapor deposition (CVD), plasma-enhanced CVD (PECVD), physical-vapor deposition (PVD), pulsed deposition layer (PDL), atomic layer deposition (ALD), spin-on application, electroplating, Langmuir-Blodgett (LB) molecular assembly, combinations thereof, and/or other processes. The gates 112 may each also comprise more than one layer, possibly including layers of different materials. The gates 112 may be arranged in a substantially radial pattern, such as the wagon-wheel spoke configuration shown in FIG. 1. Thus, the gates 112 may extend radially from a point central to the inductor 120. However, other patterns may be employed within the scope of the present disclosure.

The source/drain regions 114 may be formed by implanting impurities into the substrate 105, possibly employing a mask defining or approximating the perimeters of one or more the source/drain regions 114 or portions thereof. In one embodiment, the substrate 105 is a doped substrate, such that one or more of the source/drain regions 114 (or portions thereof) are regions protected from doping processes employed to form others of the source/drain regions 114. For example, the substrate 105 may be a P doped substrate, such that alternating ones of the source/drain regions 114 are P doped regions, and the remaining source/drain regions 114 may be N doped regions formed by implanting N type impurities into the substrate 105 through a mask substantially covering the P doped source/drain regions 114.

Two or more of the gates 112 may be interconnected such that they may be biased at substantially the same potential. For example, in the illustrated embodiment, the device 100 also includes a conductive member 116 interconnecting each of the gates 112 through a plurality of vias 118. The illustrated conductive member 116 is an arcuate or otherwise shaped member configured to interconnect two or more of the gates 112, although other shapes and/or interconnection schemes are within the scope of the present disclosure.

The conductive member 116 and the vias 118 may comprise doped or undoped polysilicon, molybdenum, hafnium, cobalt, nickel, tungsten, vanadium, bismuth, titanium, tantalum, aluminum, silicide, alloys thereof, and/or other materials, and may be formed by lithography, CVD, PECVD, PVD, PDL, ALD, spin-on application, electroplating, LB molecular assembly, combinations thereof, and/or other processes. The conductive member 116 and/or the vias 118 may also comprise more than one layer, possibly including layers of different materials. In one embodiment, gates 112 and the conductive member 116, and possibly the vias 118, may comprise substantially similar compositions. In one embodiment, the gates 112 and the conductive member 116 may be integrally formed, possibly negating the need for the vias 118. For example, the gates 112 and the conductive member 116 may be formed from a single metal layer.

The conductive member 116 and, thus, the gates 112 are directly or indirectly coupled to a biasing source. The biasing source may be integral to or separate from the device 100, and may be located proximate or remote from the conductive member 116. In one embodiment, the biasing source is an external power supply, such as $V_{cc}$ or one or more conductive members electrically coupled thereto, or a steady state or ground potential, such as $V_{ss}$ or one or more conductive members coupled thereto. By biasing the gates 112, the resistance of at least proximate portions of the substrate 105 may be adjusted, thereby influencing the inductance of the inductor 120. Thus, the inductor 120 may be tuned by adjusting the bias applied to the gates 112, such that the inductance of the inductor 120 that is most suitable to a particular operating frequency of the device 100 may be achieved. Consequently, the Q factor of the inductor 120 may be increased or decreased as necessary to optimize performance of the device 100, among other purposes. In one embodiment, the Q factor of the inductor 120 may range between about 10 and about 15. For example, the Q factor may range between about 11 and about 12.

The inductor 120 may comprise a planar, coil-shaped conductive member including a number of turns. The number of turns, as well as the dimensions of the inductor 120, may be predetermined to achieve an approximate inductance range, possibly based on an approximate operating frequency range of the device 100. The inductor 120 may comprise aluminum, copper, titanium, tantalum, titanium nitride, tantalum nitride, gold, alloys thereof, and/or other materials. The inductor 120 may be formed by lithography, CVD, PECVD, PVD, PDL, ALD, spin-on application, electroplating, LB molecular assembly, damascene, lift-off, and/or other backend manufacturing techniques, combinations thereof, and/or other processes.

The inductor 120 may be directly or indirectly coupled to a current source, which may be integral to or separate from the device 100, and may be located proximate or remote from the inductor 120. In the illustrated embodiment, the inductor 120 includes portions 122, 124 extending away from the coiled portion to be connected to a current source and/or ground, wherein the portion 124 includes conductors in more than one metal layer coupled by vias 118.

Figure 2:
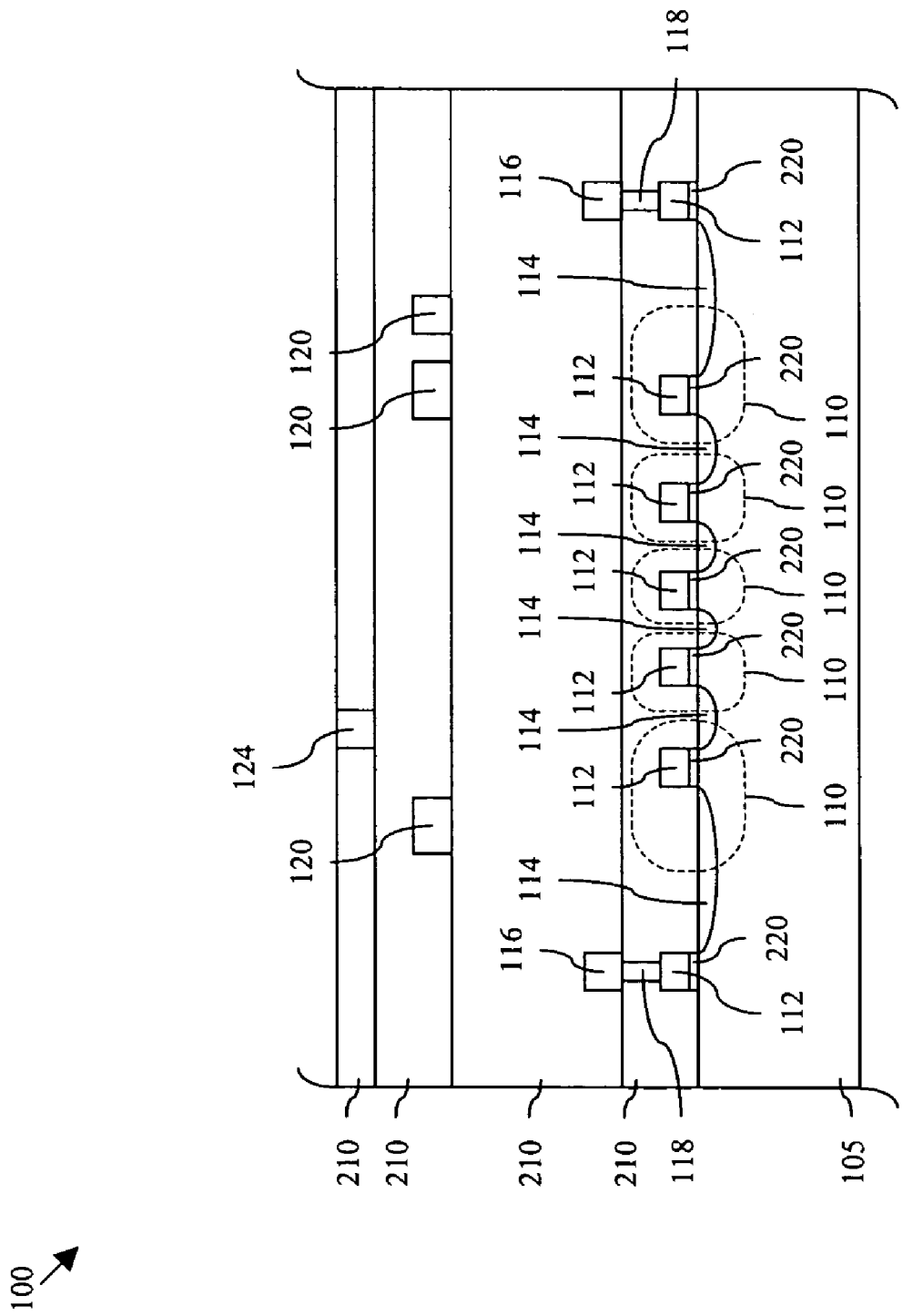
FIG. 2 is a sectional view of the device shown in FIG. 1.

Referring to FIG. 2, with continued reference to FIG. 1, illustrated is a sectional view of at least a portion of the microelectronic device 100 shown in FIG. 1. As with FIG. 1, several of the active devices 110 are identified in FIG. 2 by dashed lines.

The device 100 also includes one or more dielectric layers 210 interposing the inductor 120 and the active devices 110, and possibly interposing portions of the inductor 120. The dielectric layers 210, which may each include multiple layers, may comprise silicon dioxide, fluoride-doped glass (FSG), SILK (a product of Dow Chemical of Michigan), BLACK DIAMOND (a product of Applied Materials of Santa Clara, Calif.), and/or other materials, and may be formed by CVD, PECVD, PDL, ALD, PVD, spin-on coating, and/or other processes.

The device 100 may also include one or more gate insulating layers 220 electrically isolating the gates 112 from the substrate 105. The gate insulating layers 220 may comprise SiO, $SiO_2$, SiN, $SiO_xN_y$, TaN, TiN, $Ta_2O_5$, $HfO_2$, $ZrO_2$, HfSiON, $HfSi_x$, $HfSi_xN_y$, $HfAlO_2$, $NiSi_x$, and/or other materials. The gate insulating layers 220 may be formed by ALD, PDL, CVD, PECVD, evaporation, and/or other methods, possibly to a thickness ranging between about 2 angstroms and about 80 angstroms.

The conductive member 116 may be defined in a metal layer formed over the gates 112, such that vias 118 may be employed to connect the conductive member 116 to ones or each of the gates 112. Similarly, the inductor 120 and inductor portion 124 may be formed in or defined from metal layers formed over the metal layer from which the conductive member 116 is defined. Although not shown in FIG. 2, the device 100 may also include additional metal and dielectric layers between the inductor 120 and the active devices 110, such as those employed to form an interconnect structure. However, in one embodiment, a columnar region having a cross-sectional shape substantially defined by, conforming to, or corresponding to the perimeter of the inductor 120 and having a length or height substantially spanning the separation between the inductor 120 and the active devices 110 may be substantially free of any materials other than portions of one or more dielectric layers 210. For example, the columnar region may be substantially void of any metallic or otherwise conductive features.

Figure 3:
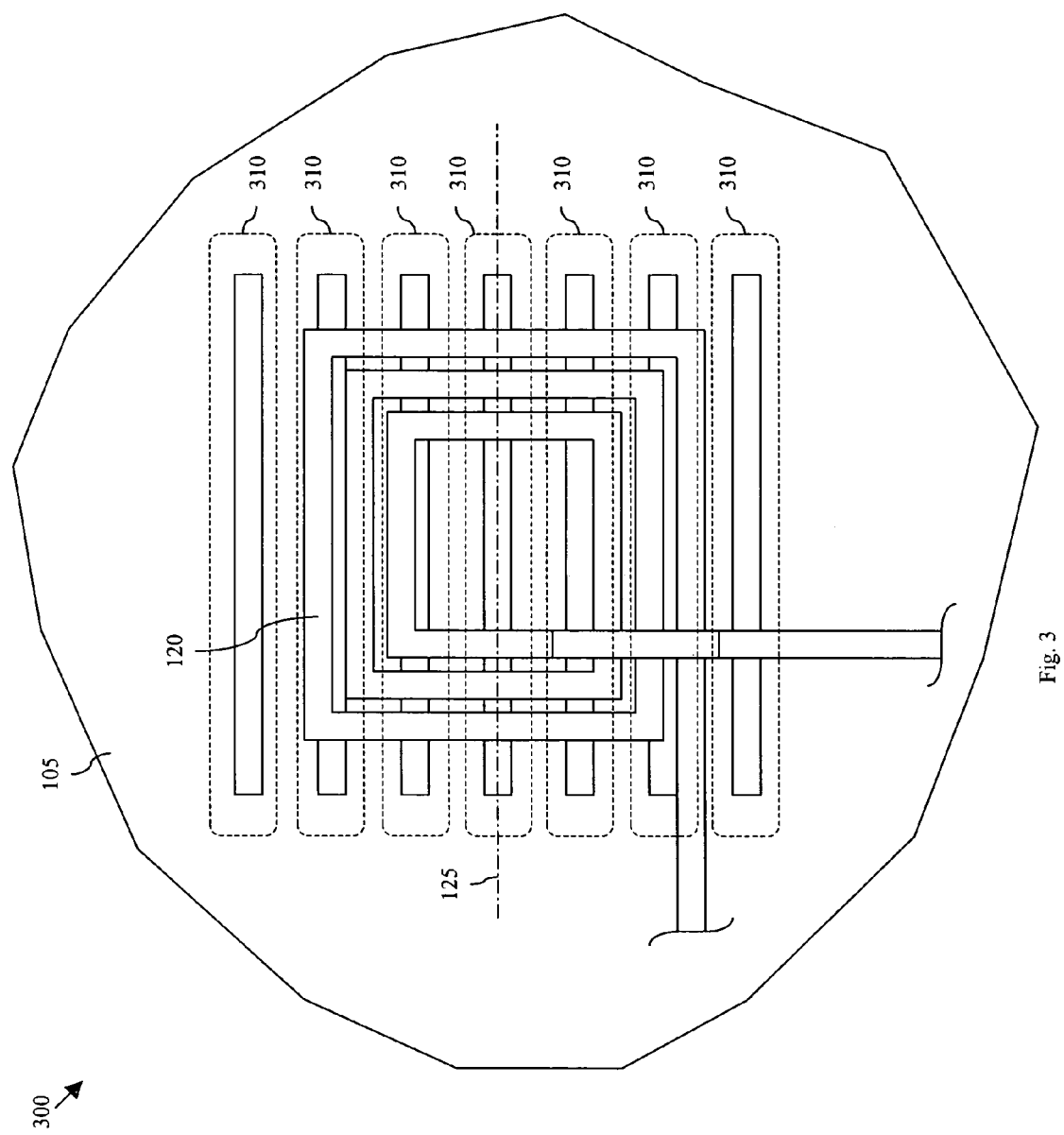
FIG. 3 is a plan view of at least a portion of another embodiment of a microelectronic device in an intermediate stage of manufacture according to aspects of the present disclosure.

Referring to FIG. 3, illustrated is a plan view of at least a portion of another embodiment of the microelectronic device 100 shown in FIG. 1, herein designated by the reference numeral 300. The device 300 is substantially similar to the device 100. However, the layout of the active devices 110 shown in FIG. 1 has been modified in the embodiment shown in FIG. 3. The device 300 includes active devices 310 that are substantially similar to the devices 110 shown in FIG. 1. However, the devices 310 are not arranged in a radial configuration. In contrast, the devices 310 are each substantially parallel to neighboring devices 310, and are also each substantially parallel to a primary (e.g., longitudinal) axis 125 of the inductor 120. The devices 310 may also or additionally be substantially parallel to some portions or segments of the inductor 120, and substantially perpendicular to other portions or segments of the inductor 120.

Figure 4:
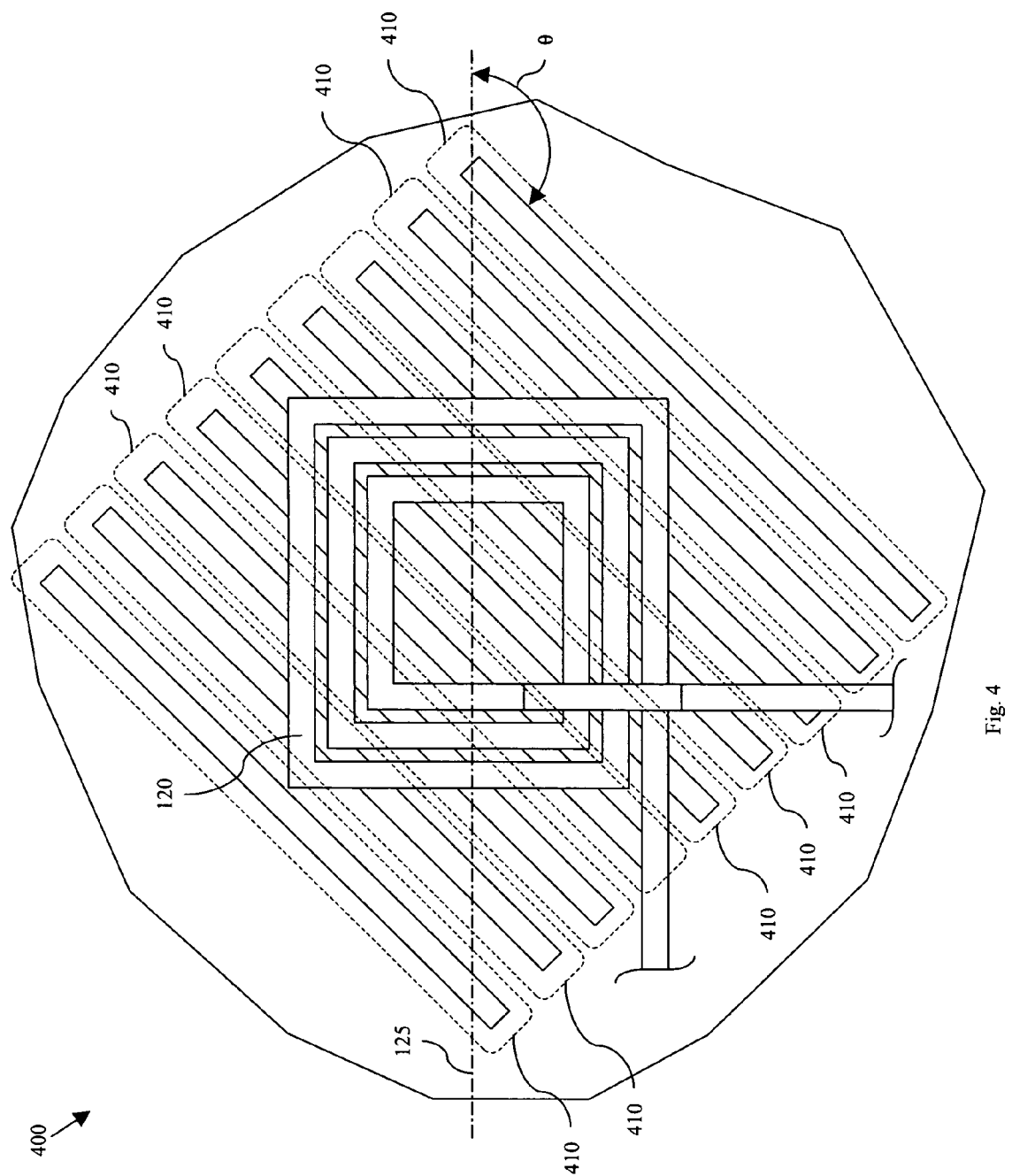
FIG. 4 is a plan view of at least a portion of another embodiment of a microelectronic device in an intermediate stage of manufacture according to aspects of the present disclosure.

Referring to FIG. 4, illustrated is a plan view of at least a portion of another embodiment of the microelectronic device 100 shown in FIG. 1, herein designated by the reference numeral 400. The device 400 is substantially similar to the device 100. However, the layout of the active devices 110 shown in FIG. 1 has been modified in the embodiment shown in FIG. 4. The device 400 includes active devices 410 that are substantially similar to the devices 110 shown in FIG. 1. However, the devices 410 are not arranged in a radial configuration. In contrast, the devices 410 are each substantially parallel to neighboring devices 410, and are also each substantially non-parallel and non-perpendicular to an axis 125 of the inductor 120. For example, in the illustrated embodiment, the devices 410 are arranged at an angle θ that is about 45 degrees relative to the axis 125. However, the angle θ may range between about 0 degrees and about 90 degrees within the scope of the present disclosure. In one embodiment, ones or all of the devices 410 are substantially non-parallel and/or non-perpendicular to all portions or segments of the inductor 120. Moreover, as described above, the layout of the devices 410 may vary from the embodiments shown in FIGS. 1, 3, and 4 within the scope of the present disclosure.

Figure 5:
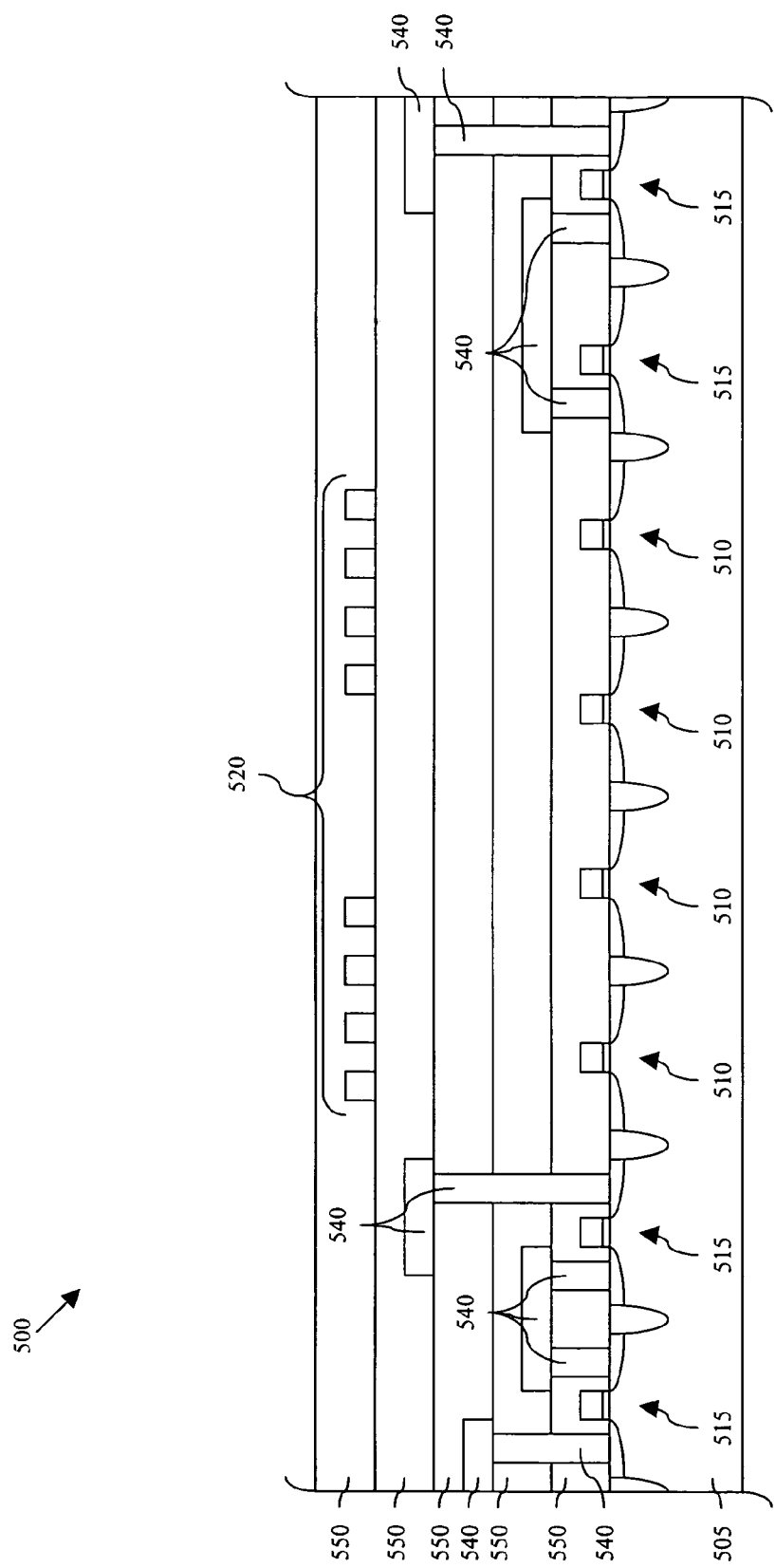
FIG. 5 is a sectional view of at least a portion of one embodiment of an integrated circuit device according to aspects of the present disclosure.

Referring to FIG. 5, illustrated is a sectional view of at least a portion of one embodiment of an integrated circuit device 500 according to aspects of the present disclosure. The integrated circuit device 500 is one environment in which the microelectronic devices 100, 300, and 400 of FIGS. 1, 3, and 4, respectively, may be implemented. For example, the integrated circuit device 500 includes a plurality of active devices 510, 515 formed on and/or at least partially in a substrate 505, and also includes an inductor 520 located over ones of the active devices 510, 515.

The substrate 505 may be substantially similar to the substrate 105 shown in FIG. 1. Ones of the active devices 510, 515 may also be substantially similar to the active devices 110 described in reference to FIG. 1. For example, the active devices 510 are configured to adjust the resistance of the substrate 505 based on a biasing potential applied to the devices 510, thereby allowing the inductor 520 to be tuned, such as for a particular operating frequency. However, the active devices 515 may be configured for storage, logic, and other purposes, and may be interconnected with the inductor 520.

The integrated circuit device 500 also includes interconnects 540 extending along and/or through one or more dielectric layers 550 to ones of the microelectronic devices 515 and/or the devices 510. The interconnects 540 may comprise copper, tungsten, gold, aluminum, carbon nanotubes, carbon fullerenes, refractory metals and/or other materials, and may be formed by CVD, PECVD, ALD, PVD, and/or other processes. The dielectric layers 550 may comprise silicon dioxide, BLACK DIAMOND (a product of Applied Materials of Santa Clara, Calif.), and/or other materials, and may be formed by CVD, PECVD, ALD, PVD, spin-on coating, and/or other processes. The dielectric layers 550 may have a thickness ranging between about 2000 angstroms and about 15,000 angstroms.

Thus, the present disclosure provides a microelectronic device including, in one embodiment, a plurality of active devices located at least partially in a substrate, at least one dielectric layer located over the plurality of active devices, and an inductor located over the dielectric layer. At least one of the plurality of active devices is located within a columnar region having a cross-sectional shape substantially conforming to a perimeter of the inductor.

The present disclosure also introduces a method of manufacturing a microelectronic device including, in one embodiment, forming a plurality of active devices at least partially in a substrate, forming at least one dielectric layer over the plurality of active devices, and forming an inductor over the dielectric layer. At least one of the plurality of active devices is formed within a columnar region having a cross-sectional shape substantially conforming to a perimeter of the inductor.

The present disclosure also provides a method of tuning a microelectronic device having a plurality of active devices located at least partially in a substrate, at least one dielectric layer located over the plurality of active devices, and an inductor located over the dielectric layer, wherein at least one of the plurality of active devices is located within a columnar region having a cross-sectional shape substantially conforming to a perimeter of the inductor. In one embodiment, the method includes determining an operating frequency of the microelectronic device and biasing the at least one of the plurality of active devices with an electrical potential based on the operating frequency.

An integrated circuit device is also provided in the present disclosure. In one embodiment, the integrated circuit device includes a plurality of active devices located at least partially in a substrate, at least one dielectric layer located over the plurality of active devices, and an inductor located over the dielectric layer. At least one of the plurality of active devices is located within a columnar region having a cross-sectional shape substantially conforming to a perimeter of the inductor. The integrated circuit device also includes one or more interconnects interconnecting ones of the plurality of active devices not located within the columnar region.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectronic device, comprising:
a plurality of active devices located at least partially in a substrate;
at least one dielectric layer located over the plurality of active devices;
an inductor located over the dielectric layer, wherein each of the plurality of active devices is at least partially located within a columnar region having a cross-sectional shape substantially conforming to a perimeter of the inductor, and wherein each of the plurality of active devices is also partially located outside the columnar region;
at least one conducting member interconnecting the plurality of active devices, wherein the at least one conducting member vertically interposes the inductor and at least one of the plurality of active devices without physically connecting to the inductor; and a plurality of additional active devices each located at least partially in the substrate but substantially not within the columnar region.

2. The device of claim 1 wherein at least one of the plurality of active devices that are each at least partially located within the columnar region is a field effect transistor.

3. The device of claim 1 wherein the plurality of active devices that are each at least partially located within the columnar region are configured in a radial configuration.

4. The device of claim 3 wherein the plurality of active devices that are each at least partially located within the columnar region each have gates extending radially from a point central to the inductor.

5. The device of claim 1 wherein the plurality of active devices that are each at least partially located within the columnar region are each substantially parallel to a neighboring one of the plurality of active devices.

6. The device of claim 5 wherein the plurality of active devices that are each at least partially located within the columnar region are each substantially parallel to a primary axis of the inductor.

7. The device of claim 5 wherein the plurality of active devices that are each at least partially located within the columnar region are each substantially non-parallel and non-perpendicular to a primary axis of the inductor.

8. The device of claim 1 wherein the at least one conducting member is configured to substantially simultaneously provide a bias to each of the plurality of active devices that are each at least partially located within the columnar region.

9. The device of claim 8 wherein the at least one conducting member is configured to provide a substantially similar bias to each of the plurality of active devices that are each at least partially located within the columnar region.

10. The device of claim 9 wherein the bias applied to the interconnected ones of the plurality of active devices is based on a desired quality factor of the inductor.

11. The device of claim 9 wherein the bias applied to the interconnected ones of the plurality of active devices is based on an operating frequency of the microelectronic device.

12. The device of claim 1 wherein the inductor has a quality factor ranging between about 10 and about 15.

13. The device of claim 1 wherein the inductor has a quality factor ranging between about 11 and about 12.

14. A method of manufacturing a microelectronic device, comprising:
    forming a plurality of active devices at least partially in a substrate;
    forming at least one dielectric layer over the plurality of active devices;
    forming at least one conducting member interconnecting each of the plurality of active devices;
    forming an inductor over the dielectric layer and the at least one conducting member, wherein each of the plurality of active devices is formed at least partially within a columnar region having a cross-sectional shape substantially conforming to a perimeter of the inductor, and wherein each of the plurality of active devices is also partially located outside the columnar region; and
    forming a plurality of additional active devices at least partially in the substrate but substantially not within the columnar region.

15. The method of claim 14 wherein at least one of the plurality of active devices that are each at least partially located within the columnar region is a field effect transistor.

16. The method of claim 14 wherein the plurality of active devices that are each at least partially located within the columnar region are formed in a radial configuration.

17. The method of claim 16 wherein the plurality of active devices that are each at least partially located within the columnar region each have gates extending radially from a point central to the inductor.

18. The method of claim 14 wherein the plurality of active devices that are each at least partially located within the columnar region are each substantially parallel to a neighboring one of the plurality of active devices.

19. The method of claim 14 wherein the plurality of active devices that are each at least partially located within the columnar region are each substantially parallel to a primary axis of the inductor.

20. The method of claim 14 wherein the plurality of active devices that are each at least partially located within the columnar region are each substantially non-parallel and non-perpendicular to a primary axis of the inductor.

21. The method of claim 14 wherein the at least one conducting member is configured to provide a bias substantially simultaneously to each of the plurality of active devices that are each at least partially located within the columnar region.

22. The method of claim 21 wherein the at least one conducting member is configured to provide a substantially similar bias to each of the plurality of active devices that are each at least partially located within the columnar region.

23. The method of claim 22 wherein the bias applied to the interconnected ones of the plurality of active devices is based on a desired quality factor of the inductor.

24. The method of claim 22 wherein the bias applied to the interconnected ones of the plurality of active devices is based on an operating frequency of the microelectronic device.

25. A microelectronic device, comprising:
    a plurality of active devices collectively having a radial configuration and located at least partially in a substrate;
    at least one dielectric layer located over the plurality of active devices; and
    an inductor located over the dielectric layer, wherein each of the plurality of active devices is located at least partially within a columnar region having a cross-sectional shape substantially conforming to a perimeter of the inductor, and wherein each of the plurality of active devices is also partially located outside the columnar region;
    wherein the gate of each of the plurality of active devices is angularly offset from the gate of a neighboring one of the plurality of active devices, the angular offset being relative to an axis of rotation extending normal to the substrate proximate a central portion of the inductor.

26. The device of claim 25 wherein at least one of the plurality of active devices is a field effect transistor.

27. The device of claim 25 wherein, collectively, the plurality of active devices radially extend substantially from a first radius to a second radius.

28. The device of claim 25 wherein the plurality of active devices each have gates extending radially from a central location relative to the inductor.

29. The device of claim 25 wherein the angular offset between any pair of the plurality of active devices is substantially equal to the angular offset between any other pair of the plurality of active devices.

30. The device of claim 25 further comprising a plurality of additional active devices located within the substrate but substantially not within the columnar region.

31. The device of claim 25 further comprising a conducting member interconnecting the plurality of active devices.

32. The device of claim 31 wherein the conducting member is configured to substantially simultaneously provide a bias to each of the plurality of active devices.

33. The device of claim 32 wherein the conducting member is configured to provide a substantially similar bias to each of the plurality of active devices.

34. The device of claim 32 wherein the bias applied to the interconnected ones of the plurality of active devices is based on a desired quality factor of the inductor.

35. The device of claim 32 wherein the bias applied to the interconnected ones of the plurality of active devices is based on an operating frequency of the microelectronic device.

36. The device of claim 31 wherein the conducting member is vertically interposed between the inductor and at least one of the plurality of active devices.

37. The device of claim 25 wherein the inductor has a quality factor ranging between about 10 and about 15.

38. The device of claim 25 wherein the inductor has a quality factor ranging between about 11 and about 12.

39. The device of claim 25 wherein the columnar region between the inductor and the plurality of active devices is substantially void of conductive materials.

* * * * *